United States Patent [19]

Noguchi et al.

[11] Patent Number: 5,213,628
[45] Date of Patent: May 25, 1993

[54] PHOTOVOLTAIC DEVICE

[75] Inventors: Shigeru Noguchi, Hirakata; Hiroshi Iwata, Neyagawa; Keiichi Sano, Takatsuki, all of Japan

[73] Assignee: Sanyo Electric Co., Ltd., Osaka, Japan

[21] Appl. No.: 757,250

[22] Filed: Sep. 10, 1991

[30] Foreign Application Priority Data

Sep. 20, 1990 [JP] Japan .................. 2-252354
Nov. 29, 1990 [JP] Japan .................. 2-334971

[51] Int. Cl.$^5$ ............................ H01L 31/075
[52] U.S. Cl. .................... 136/255; 136/258; 136/261; 257/458
[58] Field of Search ............ 136/258 AM, 258 PC, 136/261, 255; 357/30 J, 30 K; 257/458

[56] References Cited

U.S. PATENT DOCUMENTS 5,066,340 11/1991 Iwamoto et al. ........... 136/258 AM

FOREIGN PATENT DOCUMENTS 62-128572 6/1987 Japan .................. 136/258 AM

Primary Examiner—Aaron Weisstuch
Attorney, Agent, or Firm—W. G. Fasse

[57] ABSTRACT

A photovoltaic device includes a monocrystalline or polycrystalline semiconductor layer of one conductivity type, a substantially intrinsic substantially amorphous semiconductor layer having a predetermined thickness small enough to avoid producing carriers therein. The substantially intrinsic, substantially amorphous layer is formed on the one conductivity type semiconductor layer, and a substantially amorphous semiconductor layer of the opposite conductivity type is formed on the intrinsic, semiconductor layer.

6 Claims, 2 Drawing Sheets

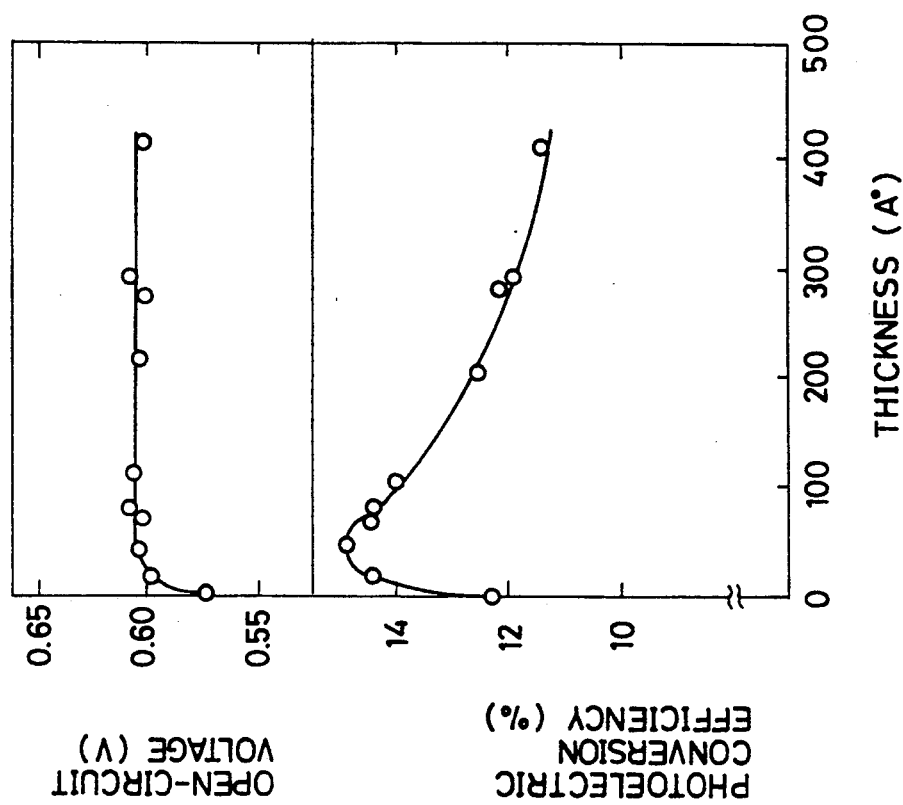
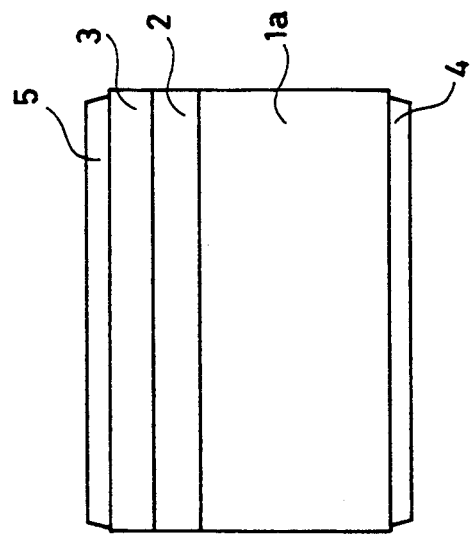

PHOTOVOLTAIC DEVICE

FIELD OF THE INVENTION

The present invention relates generally to semiconductor photovoltaic devices and, more particularly, to an improvement of the photoelectric conversion efficiency in a photovoltaic device including at least one amorphous or microcrystalline semiconductor layer.

BACKGROUND INFORMATION

In general, photovoltaic devices are classified into a monocrystal type, a polycrystalline type and a substantially amorphous type depending on the type of semiconductor layers used as photoelectric conversion layers. The present specification relates to devices having a substantially amorphous conversion layer. In recent years, active studies and developments have been made particularly in connection with photovoltaic devices of the polycrystal type and the substantially amorphous type.

The reason for the attention paid to the just mentioned devices is seen in that it is easy to form such a polycrystalline type or substantially amorphous type photovoltaic device with a large area as compared to a conventional monocrystalline type photovoltaic device. Further, the polycrystalline type or substantially amorphous type photovoltaic device requires a lower energy in its manufacture, and hence a reduction in manufacturing cost can be expected. However, although numerous results of the studies have been obtained, the polycrystalline type or substantially amorphous type photovoltaic device is still inferior in its performance relative to the monocrystalline type photovoltaic device.

Thus, as new attempts to develop photovoltaic devices, studies have been in progress recently for achieving still higher photoelectric conversion efficiencies by forming semiconductor junctions which appropriately combine a substantially amorphous semiconductor layer and a polycrystalline semiconductor layer, or a substantially amorphous semiconductor layer and a monocrystalline semiconductor layer while maintaining their respective preferable properties.

Normally, however, excellent semiconductor junctions cannot be formed merely by contacting semiconductor layers of different conductivity types with each other. For example, even if a monocrystalline semiconductor layer of one conductivity type and a substantially amorphous semiconductor layer of the opposite conductivity type, or a polycrystalline semiconductor layer of one conductivity type and an amorphous semiconductor layer of the opposite conductivity type are directly contacting each other to form a pn junction, a sufficient photoelectric conversion efficiency cannot be obtained, because many of the carriers generated in the semiconductor layers by irradiation with light, disappear by recombination in the vicinity of the interface of the pn junction, and hence the carriers cannot be collected efficiently.

It is considered that the recombination of the carriers is due to localized energy levels in a polycrystalline semiconductor or in an amorphous semiconductor.

That is, generally the quality of a substantially amorphous semiconductor film deteriorates substantially when doped with conductivity type determining impurities. The deterioration is represented as an increase in localized levels within the energy band gap. The localized energy levels increase the energy levels at the interface of the pn junction whereby an increase in the recombination of carriers is caused by the increased interface energy levels.

Further, since a polycrystalline semiconductor film includes a large number of grain boundaries therein and the crystal grains have random orientations, the polycrystalline semiconductor film has increased interface energy levels. Also, there is another disadvantage because impurities are liable to segregate into the grain boundaries in the polycrystalline semiconductor film.

SUMMARY OF THE INVENTION

In view of the above art, it is an object of the present invention to provide a photovoltaic device has a photoelectric conversion efficiency that is improved by reducing the recombination of carriers at the interface of a pn junction.

A photovoltaic device according to one aspect of the present invention includes a monocrystalline semiconductor layer of one conductivity type, a substantially intrinsic, substantially amorphous semiconductor layer of 250Å or less in thickness formed on the one conductivity type semiconductor layer, and a substantially amorphous semiconductor layer of the opposite conductivity type formed on the intrinsic semiconductor layer.

A photovoltaic device according to another aspect of the present invention includes a polycrystalline semiconductor layer of one conductivity type, a substantially intrinsic amorphous semiconductor layer of 350Å or less in thickness formed on the one conductivity type semiconductor layer, and an amorphous semiconductor layer of the opposite conductivity type formed on the intrinsic semiconductor layer.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a side view showing a photovoltaic device according to a first embodiment of the present invention.

FIG. 2 is a graph showing the photoelectric conversion characteristic of the photovoltaic device of FIG. 1.

DESCRIPTION OF THE PREFERRED EMBODIMENTS

Figure 3:
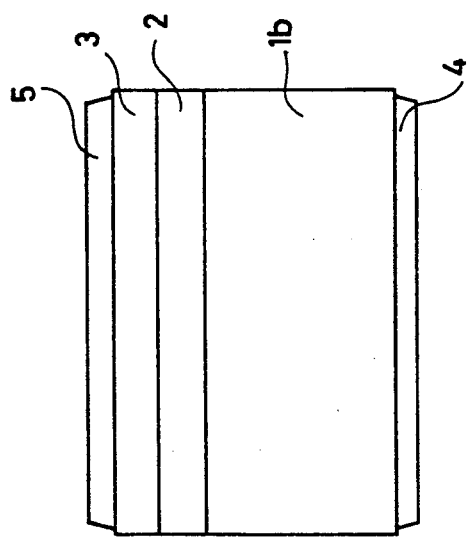
FIG. 3 is a side view of a photovoltaic device according to a second embodiment of the present invention.

FIG. 1 shows a photovoltaic device according to a first embodiment of the present invention wherein an n-type monocrystalline silicon substrate 1a is used as a one conductivity type semiconductor layer. An intrinsic amorphous silicon layer 2 is formed as the intrinsic (i type) substantially amorphous semiconductor layer on an upper main surface of the n-type monocrystalline silicon substrate 1a. A p-type amorphous silicon layer 3 is formed as a substantially amorphous layer of the opposite conductivity type on the intrinsic amorphous silicon layer 2. An aluminum layer is formed as a back electrode 4 on the lower main surface of the n-type monocrystalline silicon substrate 1a. A transparent conductive film 5 is formed of ITO (Indium Tin Oxide) or of tin oxide is formed as a front electrode on the p-type amorphous silicon layer 3. The layers 1a, 2, and 3 form a sandwich between the transparent conductive film 5 and the metal electrode 4.

The photovoltaic device of FIG. 1 can be manufactured as follows. First, n-type monocrystalline silicon substrate 1a is disposed in a plasma CVD reaction chamber. After the plasma CVD reaction chamber is exhausted of air, the substrate is heated to approximately 120° C. Then, plasma is generated in the plasma CVD reaction by a glow discharge. Energy of the plasma causes decomposition of a silicon compound gas such as silane, whereby an intrinsic amorphous silicon layer 2 of 250Å or less in thickness is formed on one main surface of the n-type monocrystalline silicon substrate 1a.

As intrinsic amorphous silicon layer 2, the p-type amorphous silicon layer 3 can then be formed on the intrinsic amorphous silicon layer 2 by employing a plasma gas decomposition method. A silicon compound gas including added diborane gas can be employed as a reaction gas for forming the p-type amorphous silicon layer 3.

A method for forming semiconductor layers by employing the above-described plasma CVD device is a conventionally known technique.

Thereafter, the transparent conductive film 5 such as of tin oxide or ITO is formed as the front electrode of the photovoltaic device by employing any known method.

Finally, the metal electrode 4 for example made of aluminum is formed as the back electrode on the other main surface of the n-type monocrystalline silicon substrate 1 by employing a known vacuum evaporation method or the like, whereby the photovoltaic device is completed.

Incidentally, a substantially amorphous semiconductor such as amorphous silicon sometimes exhibits a slight conductivity even if it is formed without any impurities added. Amorphous silicon, for example, exhibits a slight n-type, even if it does not include any conductivity type determining impurities. Therefore, in this specification, the intrinsic amorphous silicon layer includes an amorphous silicon layer that is substantially of the i-type by adding a very small amount of doping gas to the silicon layer as well as an amorphous silicon film that is formed without including any added doping gas as the conductivity type determining impurities.

FIG. 2 shows a photoelectric conversion characteristic of the photovoltaic device of FIG. 1. In the graph of FIG. 2, the abscissa represents the thickness (Å) of the intrinsic amorphous silicon layer 2, and the upper part and the lower part of the ordinate represent the open-circuit voltage (V) and photoelectric conversion efficiency (%), respectively. When the thickness of the intrinsic amorphous silicon layer 2 is zero, the photovoltaic device of FIG. 1 corresponds to that of the conventional art, and the n-type monocrystalline silicon substrate 1a makes direct contact with the p-type amorphous silicon layer 3, thereby to form a pn junction.

As can be seen from the upper part of FIG. 2, the open-circuit voltage improves even if an intrinsic amorphous silicon layer 2 of any thickness is interposed between the n-type monocrystalline silicon substrate 1a and the p-type amorphous silicon layer 3. As can be further seen from the lower part of FIG. 2, the photoelectric conversion efficiency also improves when the thickness of the intrinsic amorphous silicon layer 2 is 250Å or less. When the thickness of intrinsic amorphous silicon layer 2 is approximately 50Å, in particular, a maximum photoelectric conversion efficiency of 15% can be obtained.

On the other hand, when the thickness of intrinsic amorphous silicon layer 2 is 250Å or more, the photoelectric conversion efficiency gradually decreases. This decrease is due to the fact that the intrinsic amorphous silicon layer 2 decreases the interface levels, and carriers generated in the amorphous silicon layer 2 itself hardly contribute to the photoelectric conversion efficiency.

A lower limiting value of the thickness of the intrinsic amorphous silicon layer 2 at which the photoelectric conversion efficiency can improve is several Å, at which thickness the silicon layer can be formed and controlled by employing a normal plasma CVD apparatus, a sputtering apparatus, an atmospheric pressure CVD apparatus, or the like. In view of the ease of controlling the film thickness, however, the intrinsic amorphous silicon layer 2 is preferably formed to a thickness of approximately 20Å or more.

As described above, the interposing intrinsic substantially amorphous semiconductor layer 2 of 250Å or less in thickness between one conductivity type monocrystalline semiconductor layer 1a and an opposite conductivity type substantially amorphous semiconductor layer 3, makes it possible to decrease the recombination of carriers at the interface of the semiconductor junction and to increase the number of carriers that can be collected from the photovoltaic device.

More specifically, a large number of localized levels exist in the energy band gap of the conductive, substantially amorphous semiconductor layer 3 and these localized levels increase in the vicinity of the interface of the semiconductor junction. Interposing the intrinsic substantially amorphous semiconductor layer 2 of a good film quality between one conductivity type monocrystalline semiconductor layer 1a and the opposite conductivity type substantially amorphous semiconductor layer 3 makes it possible to decrease the extinction of the carriers due to recombination in the vicinity of the interface of the semiconductors.

The film quality of the intrinsic substantially amorphous semiconductor is superior to that of the conductive substantially amorphous semiconductor but it is inferior to that of the monocrystalline semiconductor. Thus, limiting the thickness of the intrinsic substantially amorphous semiconductor layer to 250Å or less prevents a decrease in the photoelectric conversion efficiency.

FIG. 3 shows a photovoltaic device according to a second embodiment of the present invention wherein the one conductivity type monocrystalline semiconductor substrate 1a is replaced by an n-type polycrystalline silicon substrate 1b. The photovoltaic device of FIG. 3 can be manufactured by a known method similarly to that of the FIG. 1 embodiment.

Figure 4:
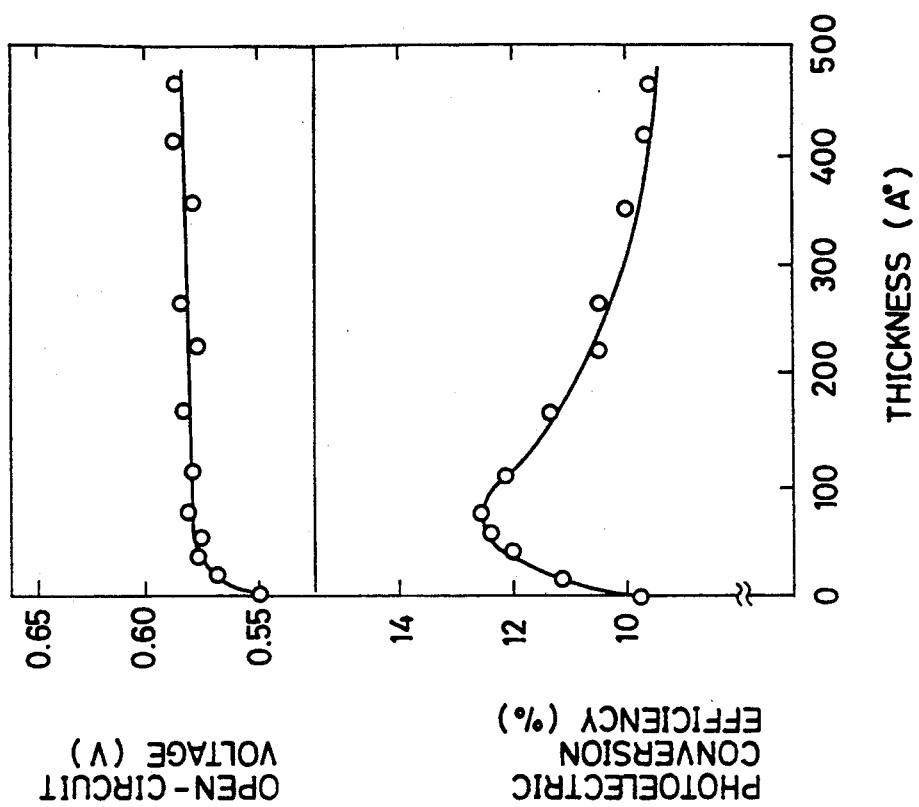
FIG. 4 is a graph showing a photoelectric conversion characteristic of the photovoltaic device of FIG. 3.

While the graph of FIG. 4 is similar to that of FIG. 2, it represents the photoelectric conversion characteristic of the photovoltaic device of FIG. 3. As can be seen from the upper part of FIG. 4, the open-circuit voltage improves also in the photovoltaic device of FIG. 3 even if the intrinsic amorphous silicon layer 2 of any thickness is interposed between the n-type polycrystalline silicon substrate 1b and the p-type amorphous silicon layer 3. As can be seen from the lower part of FIG. 4, when the thickness of the intrinsic amorphous silicon layer 2 is 350Å or less, the photoelectric conversion efficiency also improves. Especially, when the thickness of the intrinsic amorphous silicon layer 2 is approximately 70Å, the photoelectric conversion efficiency becomes maximal. Comparing FIG. 4 and FIG. 2, the photovoltaic device of FIG. 3 has a slightly lower open-circuit voltage and a slightly lower photoelectric conversion efficiency as compared to those of the photovoltaic device of FIG. 1, because although the amorphous semiconductor layer 3 increases the interface levels, the monocrystalline semiconductor substrate 1a hardly increases the interface levels in the photovoltaic device of FIG. 1, whereas the polycrystalline semiconductor substrate 1b and the amorphous semiconductor layer 3 increase interface levels in the photovoltaic device of FIG. 3. However, the photovoltaic device of FIG. 3 including the intrinsic amorphous semiconductor layer 2 of approximately 70Å in thickness is not only superior in photoelectric conversion efficiency to the photovoltaic device of the prior art including no intrinsic amorphous semiconductor layer between the n-type monocrystalline semiconductor substrate and the p-type amorphous semiconductor layer, but also uses the polycrystalline semiconductor substrate 1b which is far cheaper than the monocrystalline semiconductor substrate 1a. Therefore, the photovoltaic device of FIG. 3 and that of FIG. 1 are both sufficiently preferable for practical use.

Incidentally, the formation of the intrinsic amorphous silicon layer between the p-type semiconductor layer and the n-type semiconductor layer in the foregoing embodiments, would appear to be similar to the formation of a pin junction structure by sequentially stacking a p-layer, an i-layer, and an n-layer in a photovoltaic device including only amorphous silicon layers.

However, an important feature of the present invention is to interpose an intrinsic substantially amorphous semiconductor layer between the semiconductor layers in different states such as a monocrystalline, a polycrystalline and an amorphous semiconductor. Further, a principal feature of the present invention is to make the substantially intrinsic, substantially amorphous semiconductor layer so thin as not to produce any carriers therein rather than to produce carriers therein by irradiation with light as described above.

Therefore, the pin structure according to the present invention is totally different in object, structure and effect from the pin structure in the photovoltaic device including only conventional amorphous silicon layers.

While an example using an n-type semiconductor as a semiconductor substrate has been described in the foregoing embodiments, it is clear that a p-type semiconductor substrate or an n-type substantially amorphous semiconductor layer may be employed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device, comprising: a light transparent electrode (5), a back electrode (4), and a semiconductor sandwich structure between said electrodes, said semiconductor sandwich structure comprising a first layer of a monocrystalline semiconductor of one conductivity type; a second layer of a substantially intrinsic, substantially amorphous semiconductor having a thickness of 250Å or less formed on said first layer; and a third layer of a substantially amorphous semiconductor of the opposite conductivity type formed on said second layer to form said sandwich structure, said thickness of 250Å or less being so thin that carrier formation in said second layer is substantially prevented, whereby the photo conversion efficiency is improved.

2. The photovoltaic device of claim 1, wherein said second layer has a thickness of 150Å or less.

3. The photovoltaic device of claim 2, wherein said second layer has a thickness of 100Å or less.

4. A photovoltaic device, comprising: a light transparent electrode (5), a back electrode (4), and a semiconductor sandwich structure between said electrodes, said semiconductor sandwich structure comprising a first layer of a polycrystalline semiconductor of one conductivity type; a second layer of a substantially intrinsic, amorphous semiconductor having a thickness of 350Å or less formed on said first layer; and a third layer of an amorphous semiconductor of the opposite conductivity type formed on said second layer to form said sandwich structure, said thickness of 350Å or less being so thin that carrier formation in said second layer is substantially prevented, whereby the photo conversion efficiency is improved.

5. The photovoltaic device of claim 4, wherein said second layer has a thickness of 200Å or less.

6. The photovoltaic device of claim 5, wherein said second layer has a thickness in the range of 20 to 150Å.

* * * * *